(12) United States Patent
Wang et al.

(10) Patent No.: US 9,134,494 B2
(45) Date of Patent: Sep. 15, 2015

(54) OPTICAL INTERCONNECT

(71) Applicant: 3M INNOVATIVE PROPERTIES COMPANY, St. Paul, MN (US)

(72) Inventors: Ding Wang, Austin, TX (US); Terry L. Smith, Roseville, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/391,046

(22) PCT Filed: May 14, 2013

(86) PCT No.: PCT/US2013/040831
§ 371 (c)(1),
(2) Date: Oct. 7, 2014

(87) PCT Pub. No.: WO2013/180943
PCT Pub. Date: Dec. 5, 2013

(65) Prior Publication Data
US 2015/0117824 A1    Apr. 30, 2015

Related U.S. Application Data

(60) Provisional application No. 61/652,478, filed on May 29, 2012.

(51) Int. Cl.
*G02B 6/26* (2006.01)
*G02B 6/43* (2006.01)
*G02B 6/36* (2006.01)
*H05K 1/02* (2006.01)
(Continued)

(52) U.S. Cl.
CPC .............. *G02B 6/43* (2013.01); *G02B 6/3608* (2013.01); *H05K 1/0274* (2013.01); *G02B 6/32* (2013.01); *G02B 6/4214* (2013.01); *H05K 2201/09709* (2013.01); *H05K 2201/2054* (2013.01)

(58) Field of Classification Search
USPC ......................................... 385/93, 33, 47, 77
See application file for complete search history.

(56) References Cited

U.S. PATENT DOCUMENTS 4,078,852 A    3/1978  Lebduska
4,421,383 A   12/1983  Carlsen
(Continued)

FOREIGN PATENT DOCUMENTS

CN         203519873       4/2014
GB           2322479       8/1998
(Continued)

OTHER PUBLICATIONS

International Search Report for PCT Application No. PCT/US2013/040831, mailed on Aug. 20, 2013, 4 pages.

*Primary Examiner* — Eric Wong
(74) *Attorney, Agent, or Firm* — Clifton F. Richardson

(57) ABSTRACT

The disclosure generally relates to sets of optical waveguides such as optical fiber ribbons and embedded optical waveguides (132*a-d*), and optical interconnects useful for connecting multiple optical waveguides such as in optical fiber ribbon cables and printed circuit boards having optoelectronic capabilities. In particular, the disclosure provides an efficient, compact, and reliable optical waveguide connector (100) that incorporates microlenses and re-directing elements (136*a-d*) which combine the features of optical waveguide alignment, along with redirecting and shaping of the optical beam.

20 Claims, 8 Drawing Sheets

(51) Int. Cl.
*G02B 6/32* (2006.01)
*G02B 6/42* (2006.01)

(56) References Cited

U.S. PATENT DOCUMENTS

| | | |
|---|---|---|
| 7,033,084 B2 | 4/2006 | Lappohn |
| RE41,147 E | 2/2010 | Pang |
| 2003/0020986 A1 | 1/2003 | Pang |
| 2004/0033016 A1 | 2/2004 | Kropp |
| 2004/0037512 A1 | 2/2004 | Cho |
| 2004/0197045 A1 | 10/2004 | Lappohn |
| 2005/0047729 A1 | 3/2005 | Vilgiate |
| 2005/0089276 A1 | 4/2005 | Yoon |
| 2005/0176161 A1 | 8/2005 | Bapst |
| 2005/0218305 A1 | 10/2005 | Tsukamoto |
| 2011/0064358 A1* | 3/2011 | Nishimura ............ 385/33 |
| 2014/0193116 A1* | 7/2014 | Bylander et al. ......... 385/33 |
| 2014/0193124 A1* | 7/2014 | Bylander et al. ......... 385/93 |

FOREIGN PATENT DOCUMENTS

| | | |
|---|---|---|
| JP | 2008-251785 | 10/2008 |
| WO | WO 2013-048730 | 4/2013 |
| WO | WO 2013-048743 | 4/2013 |
| WO | WO 2013-180943 | 12/2013 |

* cited by examiner

OPTICAL INTERCONNECT

TECHNICAL FIELD

The present invention relates to an optical interconnect for connecting optoelectronic devices and printed circuit boards (PCBs).

BACKGROUND

Optical fiber connectors are used to connect optical fibers or waveguides in a variety of applications including: the telecommunications network, local area networks, data center links, and for internal links in high performance computers. These connectors can be grouped into single fiber and multiple fiber designs and also grouped by the type of contact. Common contact methods include: physical contact wherein the mating fiber tips are polished to a smooth finish and pressed together; index matched, wherein a compliant material with an index of refraction that is matched to the core of the fiber fills a small gap between the mated fiber tips; and air gap connectors, wherein the light passes through a small air gap between the two fiber tips. With each of these contact methods a small bit of dust tips of the mated fibers can greatly increase the light loss.

Another type of optical connector is referred to as an expanded beam connector. This type of connector allows the light beam in the source connector to exit the fiber core and diverge within the connector for a short distance before the light is collimated to form a beam with a diameter substantially greater than the core. In the receiving connector the beam is then focused back to its original diameter on the tip of the receiving fiber. This type of connector is less sensitive to dust and other forms of contamination.

The optical cables used in many applications make use of fiber ribbons. These ribbons are comprised of a set of coated fibers joined together in a line (typically 4, 8 or 12 fibers in a line). The individual glass fibers with their protective coatings are typically 250 microns in diameter and the ribbons typically have a fiber to fiber pitch of 250 microns. This 250 micron spacing has also been used in optical transceivers with a variety of designs spacing the active optical devices at the same 250 micron spacing.

Currently available expanded beam multiple fiber connectors typically limit the beam diameter to 250 microns to match the ribbon pitch. In order to achieve a beam diameter greater than the fiber pitch, current connectors require the fiber ribbon to be manually split into single fibers before mounting the fibers on the connector.

In general, single fiber optical connectors include a precision cylindrical ferrule for aligning and contacting optical fiber end faces with each other. The optical fiber is secured in the central bore of the ferrule so that the fiber optical core is centered on the ferrule axis. The fiber tip is then polished to allow physical contact of the fiber core. Two such ferrules can then be aligned with each other using an alignment sleeve with the polished fiber tips pressed against each other to achieve a physical contact optical connection from one fiber to another. Physical contact optical connectors are widely used.

Multiple fiber connectors often use a multiple fiber ferrule such as the MT ferrule to provide optical coupling from the source fibers to the receive fibers. The MT ferrule guides the fibers in an array of molded bores to which the fibers are typically bonded. Each ferrule has two additional bores in which guide pins are located to align the ferrules to each other and thus align the mated fibers.

A variety of other methods have also been used to make fiber to fiber connections. Included are V-groove alignment systems such as found in Volition™ optical fiber cable connectors, and bare fiber alignment in an array of precise bores. Some connecting concepts such as described in, for example, U.S. Pat. Nos. 4,078,852; 4,421,383, and 7,033,084 make use of lenses and or reflecting surfaces in optical fiber connections. Each of these connecting concepts describes single purpose connection systems, such as an in line connector or a right angle connector.

It would be advantageous to provide an expanded beam connector that can terminate fiber ribbons without separating the fibers and also provide a beam with a diameter greater than the fiber-to-fiber pitch.

SUMMARY

The disclosure generally relates to sets of optical waveguides such as optical fiber ribbons and embedded optical waveguides, and optical interconnects useful for connecting multiple optical waveguides such as in optical fiber ribbon cables and printed circuit boards (PCBs) having optoelectronic capabilities. In particular, the disclosure provides an efficient, compact, and reliable optical waveguide connector that incorporates microlenses and a re-directing elements which combine the features of optical waveguide alignment, along with redirecting and shaping of the optical beam. In one aspect, the present disclosure provides an optical interconnect assembly that includes a first printed circuit board (PCB) assembly; a second PCB assembly; a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides. The first PCB assembly includes a first PCB and a plurality of first optical waveguides with light extractors disposed on or within the first PCB, the light extractors being staggered relative to one another. The second PCB assembly includes a second PCB plugged into a first side of the first PCB via an electrical connector and a plurality of second optical waveguides with light extractors disposed on or within the second PCB, the light extractors being staggered relative to one another, each second optical waveguide in the plurality of second optical waveguides corresponding to a different first optical waveguide in the plurality of first optical waveguides. The light extractors of each first optical waveguide in the plurality of first optical waveguides and the corresponding second optical waveguide in the plurality of second optical waveguides being so oriented that light traveling within the first optical waveguide enters the second optical waveguide after being redirected by the light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the light extractor of the second optical waveguide.

In another aspect, the present disclosure provides an optical interconnect assembly that includes a plurality of first optical waveguides disposed in a first plane, each first optical waveguide having a first light extractor, the first light extractors being staggered relative to one another; and a plurality of second optical waveguides disposed in a second plane making an oblique angle with the first plane, each second optical waveguide having a second light extractor, the second light extractors being staggered relative to one another, each second optical waveguide in the plurality of second optical waveguides corresponding to a different first optical waveguide in the plurality of first optical waveguides. The optical interconnect assembly further includes a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides. The first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

In yet another aspect, the present disclosure provides an optical interconnect assembly that includes a first printed circuit board (PCB); a second PCB plugged into the first PCB via an electrical connector and comprising a first optoelectronic device mounted thereon; a plurality of first optical waveguides; a plurality of second optical waveguides; and an optical coupler mounted on the first PCB. Further, a first end of each first optical waveguide being optically coupled to the first optoelectronic device, each first optical waveguide having a first light extractor, the first light extractors in the plurality of first optical waveguides being staggered relative to one another; and each second optical waveguide having a second light extractor, the second light extractors in the plurality of second optical waveguides being staggered relative to one another, each second optical waveguide in the plurality of second optical waveguides corresponding to a different first optical waveguide in the plurality of first optical waveguides. Still further, the optical coupler mounted on the first PCB includes a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides. The first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

In yet another aspect, the present disclosure provides an optical interconnect assembly that includes a plurality of first optical waveguides disposed on or within a first printed circuit board (PCB), each first optical waveguide having an end face; a plurality of second optical waveguides disposed on or within a second PCB, each second optical waveguide having a light extractor, the light extractors being staggered relative to one another, each second optical waveguide in the plurality of second optical waveguides corresponding to a different first optical waveguide in the plurality of first optical waveguides; a plurality of first microlenses, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides. The end face of each first optical waveguide in the plurality of first optical waveguides and the light extractor of the corresponding second optical waveguide in the plurality of second optical waveguides being so oriented that light traveling within the first optical waveguide enters the second optical waveguide after exiting the first optical waveguide through the end face of the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale Like numbers used in the figures refer to like components. However, it will be understood that the use of a number to refer to a component in a given figure is not intended to limit the component in another figure labeled with the same number.

DETAILED DESCRIPTION

Figure 1:
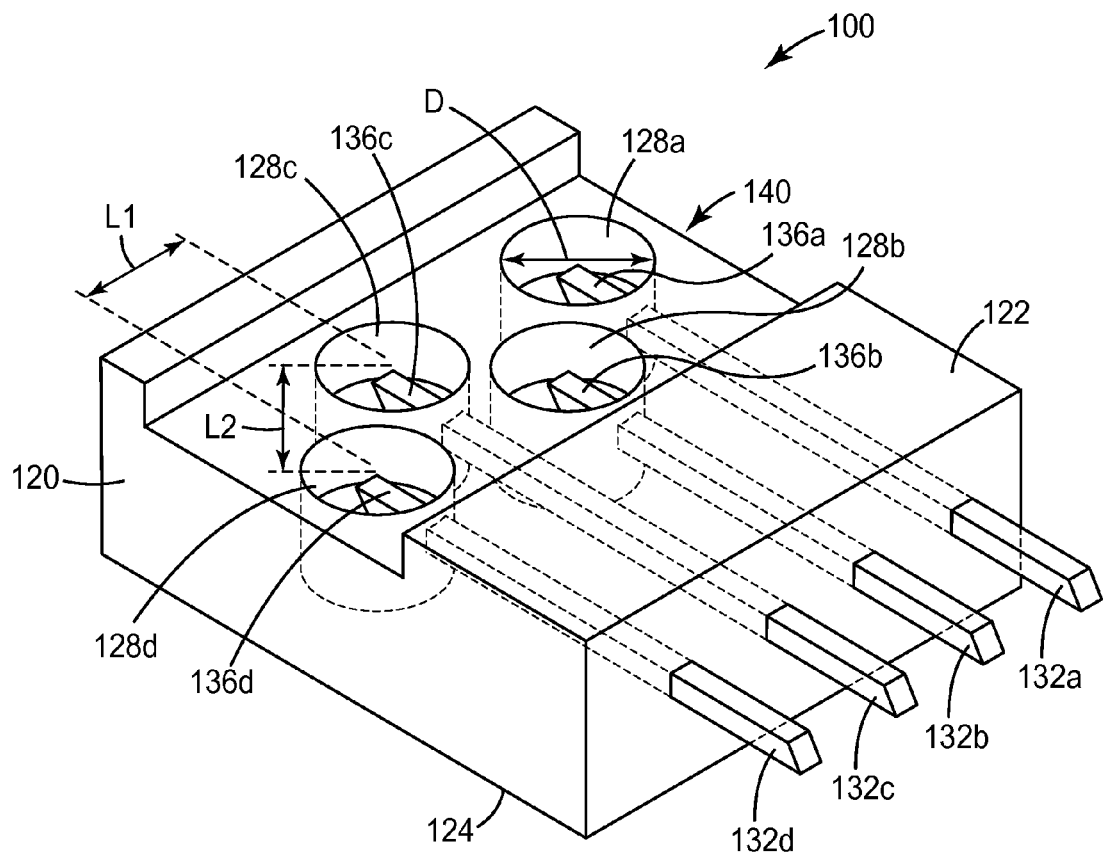
FIG. 1 shows a perspective schematic view of an optical connector.

The present disclosure provides a novel optical interconnect coupling construction that can be used to connect optical printed circuit boards together. The optical interconnect can be used with optical waveguides including polymeric or inorganic waveguides, optical fibers, ribbon cables of optical waveguides or fibers, and the like. In one particular embodiment, a smaller channel spacing (that is, more channels in same space) result from a staggered design of the optical interconnect, and larger tolerance to misalignment of optical PCB during plugging, unplugging and environment change can also result.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on," "directly connected to," "directly coupled with," or "directly in contact with" another element, there are no intervening elements, components or layers for example.

Due to the rapid increase of the amount of data communication, the data transmission speed of each physical channel carrying information data must increase correspondingly. In order to handle such high speed demand, equipment including high power computers, routers and/or switches, and servers, require interconnects capable of handling the higher data rates. These interconnects should concurrently reduce the physical size (that is, footprint) of each interconnect channel so that more channels can be put in the same space. Conversion of the data signal from electrical to optical and the use of optical waveguides such as optical fibers or polymeric waveguides to transmit optical signal can enable such interconnections. The optical signal can be modulated over, for example, 40 Gbits/s each channel and the size of each physical channel cross section can be made to range from less than about 250 microns×250 microns, which is much smaller than the electrical connection (for example, copper interconnect) counterpart.

In some cases, for example a standard server/switch/router based on copper connection, the structure inside the whole equipment box basically consists of a motherboard/backplane with many plug-in boards. The data is transferred either between plug in boards within the same equipment through the motherboard/backplane, or using a stand-alone cable to connect between backplanes of different equipment.

There are several ways that can be used to implement optical interconnects between plug-in boards within the same back panel, and plug-in boards of different back panels, so that the higher speed data transfer requirement can be accommodated. One way to build an optical interconnect is to use stand alone connectors. In some cases, a connection between plug in boards can use a stand-alone connector directly connecting optical engines near the components of different plug in boards. In some cases, a connection can use a light guide to transmit the optical signal from an optical engine to the edge of a plug-in card, and then use standalone connectors to connect two plug-in boards on the same backplane. In some cases, a connection can use a standalone connector to connect plug-in boards of different back panels. Such described connections can be constructed using either optical fibers or polymer waveguides. In one particular embodiment, the ends of an optical waveguide used for interconnection may be terminated with a connector head such as those described in U.S. Patent Application Nos. 61/539,080 entitled TRANSCEIVER INTERFACE HAVING STAGGERED CLEAVE POSITIONS; and 61/539,070 entitled MULTIPLE PURPOSE OPTICAL CONNECTING ELEMENT, both of which were filed on Sep. 26, 2011.

In one particular embodiment, the use of PCB embedded or laminated waveguides can be a desirable solution, because more channels can be packed inside the same physical space, and the channel can be configured to broadcast communication data flexibly and with ease. Also, a plug-in and -out optical PCB may be readily used, simply because the boards can be replaced in the same manner as standard electrically conducting based connecting devices on PCBs. So the plug in/plug out optical interconnect coupling can be built between plug-in board and mother board in the same manner as an electrical interconnect, and may include both optical and electrical connectors.

The waveguides can be embedded inside the PCB, be disposed on the surface of the PCB, or be ribbon cables terminating on the PCB, or they can be any combination thereof. In one particular embodiment, the light exiting from the waveguide can be re-directed by a light extractor in a direction different from the propagation direction through the waveguide. This light extraction can be due to reflection from a minor, such as 45 degree mirror formed by cleaving the end of waveguide and having either a reflective coating placed or deposited on the cleaved surface, or by Total Internal Reflection (TIR) from the cleaved surface; a 45 degree minor such as a planer mirror or a reflective surface of a prism placed to accept and re-direct light exiting the waveguide; or from one or more extraction gratings adjacent the surface of the waveguide that can extract light having one or more wavelengths, as described elsewhere. In some cases, the 45 degree mirror can be a diagonal face of a prism disposed adjacent the end of the waveguide.

Generally, PCB material is not transmissive to light with a wavelength that is used in optical data communication, so in one particular embodiment (particularly when the waveguides are embedded within the PCB), optical via holes can be etched in the PCB to let the light pass through. In one particular embodiment, the length of each waveguide is different, to allow larger via holes to be etched in a staggered orientation, so that larger diameter beam-expanding lenses can be used, as described elsewhere. The end of each waveguide is staggered in such a way that the micro lens mounted at the top surface of the optical via will have maximum available diameter. For example, if the period of waveguides is 250 microns, then the length difference between two ends of neighboring polymer waveguides is approximately 433 microns, and the micro lens diameter can be 500 microns. A typical relationship between the period of the waveguides, the length difference, and the microlens diameter is described, for example, in U.S. Patent Application No. 61/539,080 entitled TRANSCEIVER INTERFACE HAVING STAGGERED CLEAVE POSITIONS (Attorney Docket No. 66487US002).

In some cases, after the light exits from the waveguide and is collimated by a microlens, a reflecting minor mounted close to the plug in area can bend the light 90 degrees, and then the collimated light can be re-focused by a second microlens disposed on the back panel/or plug in board, can pass through the optical via holes, and enter into a waveguide on the back panel/or plug in board. Because of staggering of the waveguides and the microlenses, and the enlarged microlens diameter, the tolerance of positioning error during plug-in and plug-out of the PCB will be greatly enhanced compared to a typical current standard design in which no staggering of the components is used. This can reduce the precision requirement of the PCB plug-in interconnect design and also reduce the corresponding cost and/or increase the reliability of plug-in optical PCBs.

The present disclosure relates sets of optical waveguides including optical fiber ribbons, and fiber optic connectors useful for connecting multiple optical fibers such as in optical fiber ribbon cables and other optical waveguides including, for example, planar optical waveguides that can be fabricated from polymeric materials or glasses.

There are a number of optical waveguide/fiber connector features that users of optical fibers and waveguides desire, which are not found in currently available products. These features include low cost, robust performance against contamination, easy cleaning, compact designs, and the ability to rapidly and repeatedly connect multiple optical fibers with a single connector. A rapidly growing application for high capacity interconnections is between equipment racks in data centers where data rates of 10 Gb/s are common, and link lengths are relatively short (typically a few to 100 meters). In such applications, multiple single fiber connectors are often ganged together. Accordingly, described herein is a multiple fiber connecting technique and article which can significantly reduce the cost of multi-fiber connecting.

In both single waveguide and multi-waveguide device interfaces it is often desirable to maintain a low profile interface. This can be accomplished by routing the waveguide parallel to the circuit board and using a reflective surface to turn the light so that the beam is perpendicular to the board at the chip interface.

In one particular embodiment, the present disclosure provides an optical interconnect device for multi-waveguide optical connectors that makes use of angled reflecting surfaces and a microlens array to redirect and focus or collimate the optical beams. The use of an expanded optical beam from focusing or collimating microlenses can provide for improved resistance to transmission losses due to dirt or other impurities. The redirected beams emerge from the element perpendicular to a planar mating surface. The microlens elements can be located in a pocket and can be slightly recessed from the mating surface. The connecting elements also include mechanical features to facilitate alignment of the microlens arrays of the two mated parts. In one particular embodiment, the reflecting surfaces may be cleaved end surfaces that can be aligned at an angle to the optical axis of the optical waveguide. In some cases, the reflective surface may be coated with a reflecting material such as a metal or metal alloy to redirect the light. In some cases, the reflective surface may instead enable Total Internal Reflection (TIR) to facilitate redirecting the light.

The optical interconnect device can be encased in a connector housing that can provide support for the optical cable or the PCB, ensure alignment of interlocking components of the connector element, and provide protection from the environment. Such connector housings are well known in the art, and can include, for example, alignment holes, matching alignment pins, and the like. A similar connecting element can be used in a variety of connecting configurations. It can also be used to interface optical fibers to optical devices such as VCSELs and photodetectors using a board mounted alignment ring. It is to be understood that although the disclosure provided herein describes light travelling in one direction through the fiber and the connector, one of skill in the art should realize that light could also travel in the opposite direction through the connector, or could be bi-directional.

In one particular embodiment, the unique interfaces defined herein can be used for making internal links within high performance computers, servers, or routers. Additional applications include mating to optical back planes. Some of the prominent features of the connecting elements can include: a molded (or cast, or machined) component having a mating surface that can also include electrical connections, and a recessed area (pocket) within the mating surface; convex microlens features located within the pocket with the apex of these microlens features being within the pocket volume so that when two elements are mated with their mating surfaces in contact, a small gap exists between the microlens features; optical waveguide alignment features useful to align the optical fibers axes generally within about 15 degrees of parallel to the mating surface; and reflecting surfaces to redirect the optical beam from a first component (or PCB) to a second component (or PCB). Each optical beam is centered over one of the microlens features; and mechanical alignment features facilitate the alignment of two connecting elements so that their mating surfaces are in contact and their microlenses are aligned.

In one particular embodiment, the microlens features may collimate the light beam from the optical waveguide. Generally, collimated light can be useful for making waveguide-to-waveguide connections, since the light beam is generally expanded upon collimation, which makes the connection less susceptible to contamination by foreign material such as dust. In one particular embodiment, the microlens features may instead focus the beam so as to create a beam "waist" in the plane of the mating surface. Generally, focused beams can be useful for making fiber-to-circuit connections such as to a sensor or other active device disposed on a circuit board, since the light beam can be concentrated to a smaller region for greater sensitivity. In some cases, particularly for optical waveguide-to-waveguide connections, collimation of the light beam may be preferred, since the collimated light beams are more robust against dirt and other contamination, and also provide for greater alignment tolerances.

In one particular embodiment, the optical waveguides can be aligned using waveguide alignment features, such as within molded vee-groove features in the optical interconnect device, with the vee-grooves being parallel to the mating surface; however, vee-grooves are not required for alignment in all cases. As described herein, optional parallel vee-grooves are included, but it is to be understood that other techniques for alignment and securing of the optical fibers would also be acceptable. Furthermore, vee-grooved alignment may not be suitable in some cases and other techniques may be preferred, for example, when the optical waveguide is a planar optical waveguide. In some cases, the alignment of the optical waveguides and/or optical fibers can instead be accomplished by any of the techniques known to one of skill in the art of optical alignment using any suitable waveguide alignment feature.

A variety of mechanical feature sets may be used to align a pair of connecting elements. One feature set includes a pair of precisely positioned holes into which alignment pins or tensioned clips are placed, similar to the alignment technique used for MT ferrules. In one particular embodiment, if the holes diameters and locations are similar to that of the MT connector, then one of the connecting elements described herein could (with an appropriate set of microlenses) intermate with an MT ferrule. In some cases, particularly where PCBs are connected to backplanes, standard or modified electrical connectors can be used to secure the PCBs together and make electrical contact, and one or more separate optical interconnecting elements can be disposed adjacent to, or within the boundaries of, the electrical connectors.

Coupling the light from optical waveguide to optical waveguide, from semiconductor light sources to optical waveguide, and the related coupling light from optical waveguides to photodetector chips, has been done in a wide variety of ways (in particular for the cases where the optical waveguides are optical fibers). Achieving the desired low loss and low cost has been challenging. This is especially so when the fibers are grouped into industry standard ribbons. These ribbons contain a number of coated fibers (typical numbers are 8 or 12) having an outside diameter of about 250 um. The fibers are then laminated between a pair of thin polymer films to make a flat ribbon. Another technique for fabricating ribbons is to use an extrusion process wherein the individual coated fibers are guided through an extrusion die with a polymeric matrix material.

The present disclosure provides an improvement on previous multifiber interfaces, including transceiver interfaces, by providing a waveguide ribbon that includes individual waveguides cleaved at more than one length to allow greater space between optical devices reducing electrical interference and also allowing the use of lenses having a larger diameter to allow more effective optical coupling. In one particular embodiment, the individual waveguides can be cleaved at more than one length that results in a staggered pattern of the cleaved ends. The staggered pattern can include several rows of waveguide ends, each row including waveguides cleaved at the same length, whereas adjacent rows include adjacent fibers that are cleaved at a different length.

The present disclosure also relates in part to optical transceiver interfaces used in communication and computer networks for both external and internal links. The transceivers may be located on a motherboard, daughter board, blade, or may be integrated into the ends of an active optical cable. Also, with the ever increasing data rates, it becomes increasingly difficult to package sensitive photodetectors close to the higher power semiconductor lasers without electromagnetic interference problems. Furthermore, as bit rates increase the beam divergence of vertical cavity surface emitting lasers (VCSELs) increases. These issues make it desirable to increase the device spacing and the lens diameter.

FIG. 1 shows a perspective schematic view of an optical connector 100 according to one aspect of the disclosure. In one particular embodiment, PCB substrate 120 includes a first surface 122 and an opposing second surface 124 having a plurality of staggered vias 128a, 128b, 128c, 128d, that are disposed within an optional microlens pocket 140. Each of the plurality of staggered vias 128a, 128b, 128c, 128d extend through the PCB substrate 120 to a depth where an associated embedded optical waveguide 132a, 132b, 132c, 132d, respectively, and an associated light extractors 136a, 136b, 136c, 136d, is exposed.

Each of the plurality of staggered vias 128a, 128b, 128c, 128d are configured to accept a microlens (not shown) which have a microlens diameter D, as described elsewhere, and are disposed within optional microlens pocket 140 with a center-to-center spacing L1 corresponding to the separation of the embedded optical waveguide 132a, 132b, 132c, 132d. However, each of the staggered microlenses in staggered vias 128a, 128b, 128c, 128d have a staggered spacing L2 corresponding to the separation of the microlenses, and the staggered spacing L2 is larger than the center-to-center spacing L1. As a result, the maximum microlens diameter D that can be utilized in the connector is greater for the staggered spacing L2, as compared to the maximum microlens diameter that can be utilized in the microlens spacing L1 for non-staggered vias, as described elsewhere.

A larger staggered microlens diameter D2 is preferred. The depth of optional microlens pocket 140 serves to keep each of the microlenses below the level of first surface 122. It is to be understood that PCB substrate 120 can include any desired number of light extractors 136a-136d, staggered vias 128a-128d, number of rows of staggered vias 128a-128d, number of staggered vias 128a-128d in each row, and embedded optical waveguides 132a-132d.

In this particular embodiment, two rows of microlenses are shown with two staggered vias in each row. When used with optical waveguides having a 250 micron fiber-to-fiber spacing, this allows the associated microlenses to approach 500 microns in diameter. The use of 500 micron diameter collimating microlenses possible with the staggered fiber/microlens embodiment, allows an alignment tolerance that is less stringent than is required with 250 micron diameter microlenses possible with non-staggered vias. It is to be understood that any of the optical connectors described herein can include staggered light re-directing features and correspondingly staggered microlenses as described with reference to FIG. 1, and it may be preferable to include these staggered configurations wherever possible. Generally, the described staggered microlens designs can enable an expanded-beam optical waveguide connector that can be used for a ribbonized collection of fibers, wherein the optical beam diameter exiting the microlenses is greater than the fiber-to-fiber separation (that is, pitch) in the ribbon, and the fibers do not need to be singulated in order to accomplish the connection.

Figure 2:
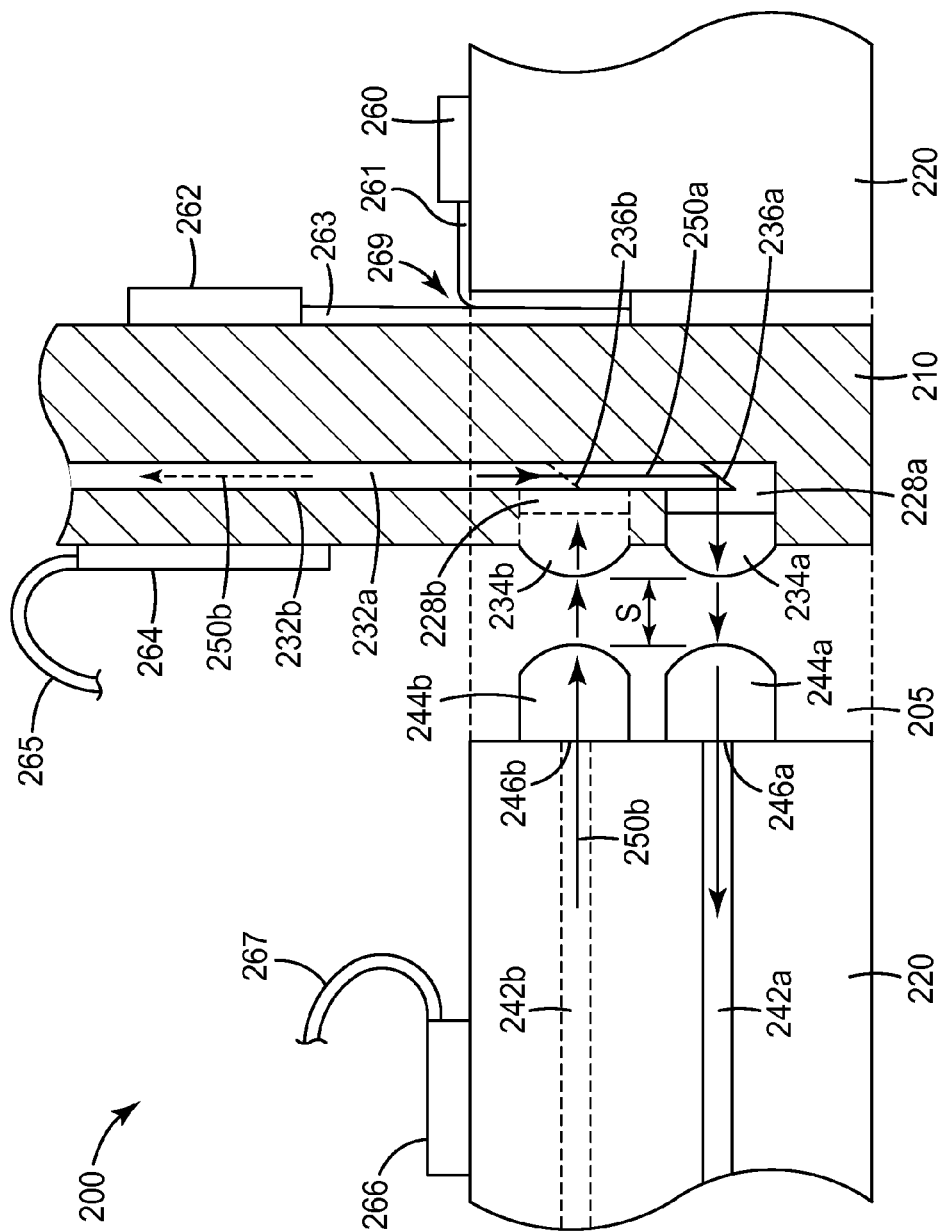
FIG. 2 shows a cross-sectional side view of a PCB optical interconnect.

FIG. 2 shows a cross-sectional side view of a PCB optical interconnect 200, according to one aspect of the disclosure. Optical interconnect 200 includes a first PCB 210 connected to a second PCB 220 in a perpendicular orientation, through a slot 205 formed in second PCB 220. Each of the first and second PCBs 210, 220, includes a plurality of optical waveguides that are arranged in a staggered orientation similar to that shown in FIG. 1. Only two of the plurality of optical waveguides in each of the first and second PCBs 210, 220, is shown in FIG. 2, although it is to be understood that there can be any desired number of staggered optical waveguides in the optical interconnect 200. First PCB 210 includes a first optical waveguide 232a with a first light extractor 236a, and a second optical waveguide 232b with a second light extractor 236b, disposed within the first PCB 210. First PCB 210 can also include a plurality of optional optoelectronic devices 264 and an optical cable 265 capable of connecting to other components, as described elsewhere.

Second PCB 220 includes a third optical waveguide 242a with a first end 246a, and a fourth optical waveguide 242b with a second end 246b, disposed within the second PCB 220. Second PCB 220 can also include a plurality of optional optoelectronic devices 266 and an optical cable 267 capable of connecting to other components as described elsewhere. The slot 205 can be cut into second PCB 220 to accommodate a first PCB 210 and features for attaching the two PCBs, such as an electrical connector (not shown).

It is to be understood that the view presented in FIG. 2 shows a cross-section through the plane generated through the first optical waveguide 232a in first PCB 210 and the corresponding third optical waveguide 242a in second PCB 220. The staggered second optical waveguide 232b and the staggered fourth optical waveguide 242b and associated components are shown for reference as dotted lines within the respective first and second PCBs 210, 220, as they reside in a plane that is different from the plane generated through the first optical waveguide 232a in first PCB 210 and the corresponding third optical waveguide 242a in second PCB 220.

First PCB 210 and second PCB 220 can make electrical contact through an electrical connector (not shown), such that, for example, optional first electronic device 260 having a first electrical pad 261 connects and makes electrical contact 269 to optional second electronic device 262 having a second electrical pad 263. A corresponding optical connection between the first and second PCBs 210, 220, is made through microlenses that are associated with each of the optical waveguides, as described elsewhere.

A first microlens 234a is disposed within a first optical via 228a to accept first light 250a from first light extractor 236a of first optical waveguide 232a. As shown in FIG. 2, first light extractor 236a can be an angle-cleaved end of the first optical waveguide 232a, however it is to be understood that any light extractor technique described herein may be substituted. First light 250a passes through first microlens 234a and is expanded as it traverses a separation distance "S" between first microlens 234a and a third microlens 244a disposed adjacent first end 246a of third optical waveguide 242a. As first light 250a passes through third microlens 244a, it is focused to enter third optical waveguide 242a through first end 246a.

A fourth microlens 244b is disposed adjacent second end 246b of fourth optical waveguide 242b, such that a second light 250b passes through the fourth microlens 244b and is expanded as it traverses the separation distance "S" between the fourth microlens 244b and a second microlens 234b. Second microlens 234b is embedded within a second optical via 228b and focuses second light 250b to second light extractor 236b and enters second optical waveguide 232b. As shown in FIG. 2, second light extractor 236b can be an angle-cleaved end of the second optical waveguide 232b, however it is to be understood that any light extractor technique described herein may be substituted.

Although first and second optical waveguides 232a, 232b, are shown in FIG. 2 to be optical waveguides that are embedded in first PCB 210, it is to be understood that in some cases, they may instead be disposed on the surface of first PCB 210. In this case, the corresponding first and second microlenses 234a, 234b, could be disposed above the surface of first PCB 210. It is also to be understood that in some cases, the third and fourth optical waveguides 242a, 242b, may be positioned further within second PCB 220 such that third and fourth microlenses 244a, 244b are also positioned within vias (not shown) and are partially embedded within PCB 220.

Further, it is to be understood that although first light 250a is shown to be travelling from first optical waveguide 232a to third optical waveguide 242a through the optical interconnect 200, and second light 250b is shown to be travelling from fourth optical waveguide 242b to second optical waveguide 232b through optical interconnect 200, each of the respective first and second light 250a, 250b, can be instead travelling in opposite directions. In other words, the optical interconnect 200 can be a bi-directional optical interconnect.

Figure 3:
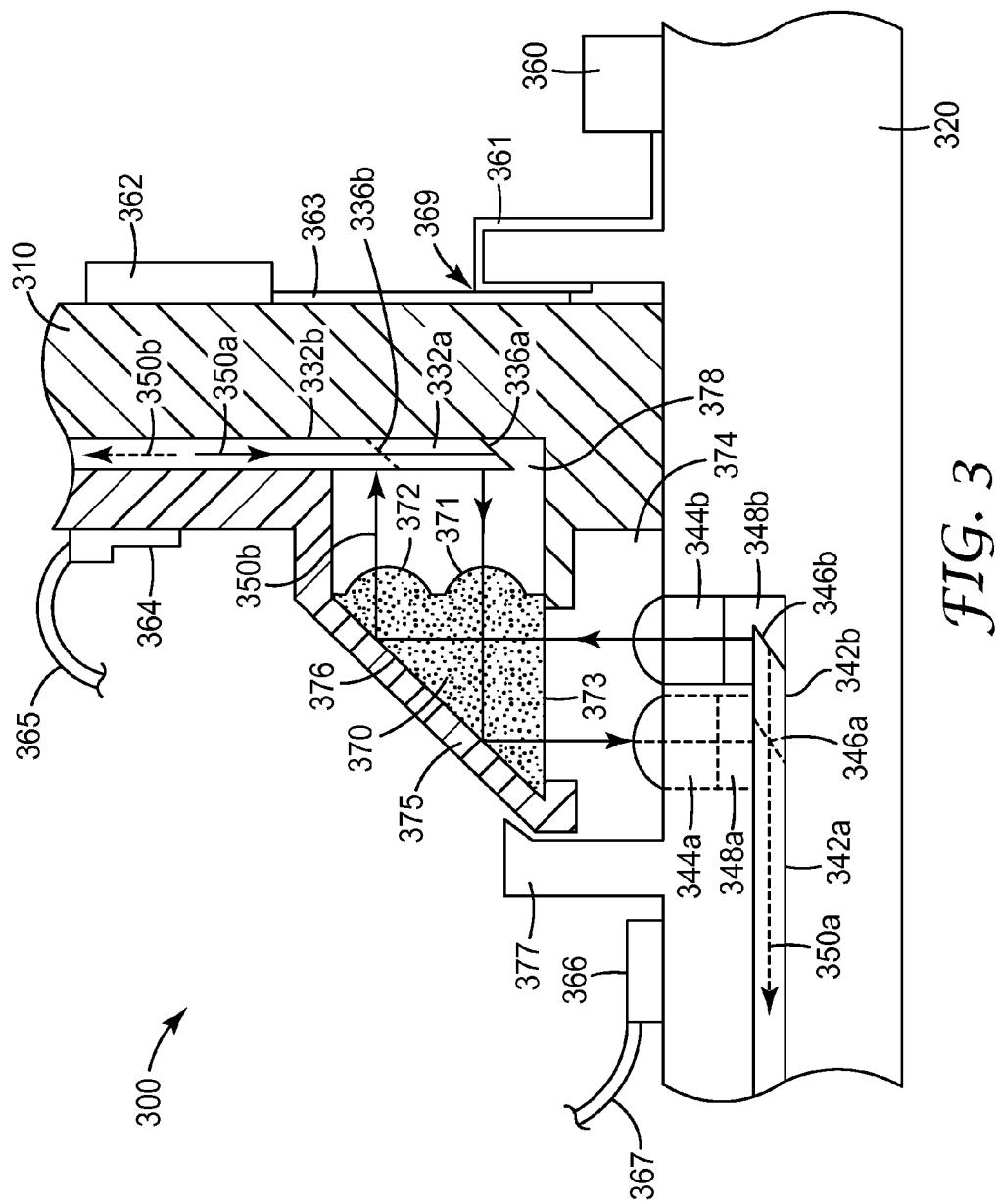
FIG. 3 shows a cross-sectional side view of a PCB optical interconnect.

FIG. 3 shows a cross-sectional side view of a PCB optical interconnect 300, according to one aspect of the disclosure. Each of the elements 310-367 shown in FIG. 3 correspond to like-numbered elements shown in FIG. 2, which have been described previously. For example, first optical waveguide 332a in FIG. 3 corresponds to first optical waveguide 232a in FIG. 2, and so on. It is to be understood that the view presented in FIG. 3 shows a cross-section through the respective optical waveguides in a similar manner as the view presented and described with reference to FIG. 2.

Optical interconnect 300 includes a first PCB 310 connected to a second PCB 320 in a perpendicular orientation, and secured using a first connector element 375 formed in first PCB 310 and mated to a second connector element 377 formed in second PCB 320. First and second connector elements 375, 377 can include features to securely fasten the two PCBs together, and may also include additional electrical contacts, as described elsewhere. Each of the first and second PCBs 310, 320, includes a plurality of optical waveguides that are arranged in a staggered orientation similar to that shown in FIG. 1. Only two of the plurality of optical waveguides in each of the first and second PCBs 310, 320 is shown in FIG. 3, although it is to be understood that there can be any desired number of staggered optical waveguides in the optical interconnect 300. First PCB 310 includes a first optical waveguide 332a with a first light extractor 336a, and a second optical waveguide 332b with a second light extractor 336b, disposed within the first PCB 310. First PCB 310 can also include a plurality of optional optoelectronic devices 364, and optical cables 365 capable of connecting to other components, as described elsewhere.

Second PCB 320 includes a third optical waveguide 342a with a third light extractor 346a, and a fourth optical waveguide 342b with a fourth light extractor 346b, disposed within the second PCB 320. Second PCB 320 can also include a plurality of optional optoelectronic devices 366, and optical cables 367 capable of connecting to other components, as described elsewhere. First PCB 310 and second PCB 320 can make electrical contact through first and second connector elements 375, 377 such that, for example, optional first electronic device 360 having a first electrical pad 361 connects and makes electrical contact 369 to optional second electronic device 362 having a second electrical pad 363. A corresponding optical connection between the first and second PCBs 310, 320, is made through microlenses that are associated with each of the optical waveguides, as described elsewhere.

A light re-directing element 370 including a reflective surface 376, a first microlens 371, a second microlens 372, and a first surface 373 is disposed within first connector element 375 such that light exiting one of the PCBs is redirected to enter the other PCB. In some cases, the light re-directing element 370 can be a prism having microlenses on one surface. In some cases (not shown), the light re-directing element 370 can instead include a reflector such as a mirror and a separate array of microlenses. It is to be understood that the light re-directing element 370 can be affixed to either first PCB 310 or second PCB 320 (or associated with the structure and features of either first or second connector element 375, 377), as known to one of ordinary skill in the art.

An optical via 378 exposes first light extractor 336a of first optical waveguide 332a and second light extractor 336b of second optical waveguide 232b. First microlens 371 of light re-directing element 370 is disposed to accept first light 350a from first light extractor 336a of first optical waveguide 232a. First light 350a passes through first microlens 371, reflects from reflective surface 376, exits light re-directing element 370 through first surface 373, and enters a third microlens 244a. Third microlens 244a is disposed in a third optical via 348a within second PCB 320, which exposes third light extractor 346a of third optical waveguide 342a. First light 350a is focused on third light extractor 346a and is injected into third optical waveguide 342a.

A fourth microlens 344b is disposed in a fourth optical via 348b within second PCB 320, which exposes fourth light extractor 346b of fourth optical waveguide 342b, such that a second light 350b extracted from fourth optical waveguide 342a passes through the fourth microlens 344b and enters light re-directing element 370 through first surface 373. Second light 350b reflects from reflective surface 376, passes through second microlens 372, is focused onto second light extractor 336b, and enters second optical waveguide 332b.

In a similar manner as described in FIG. 2, the light extractors as shown in FIG. 3 can be angle-cleaved ends of the optical waveguides; however it is to be understood that any light extractor technique described herein may be substituted. Further, it is to be understood that each of the optical waveguides may be embedded or they may be disposed on the surface of each PCB in a manner similar to that described with reference to FIG. 2. Still further, the optical interconnect 300 can be a bi-directional optical interconnect, as described elsewhere.

Figure 4A:
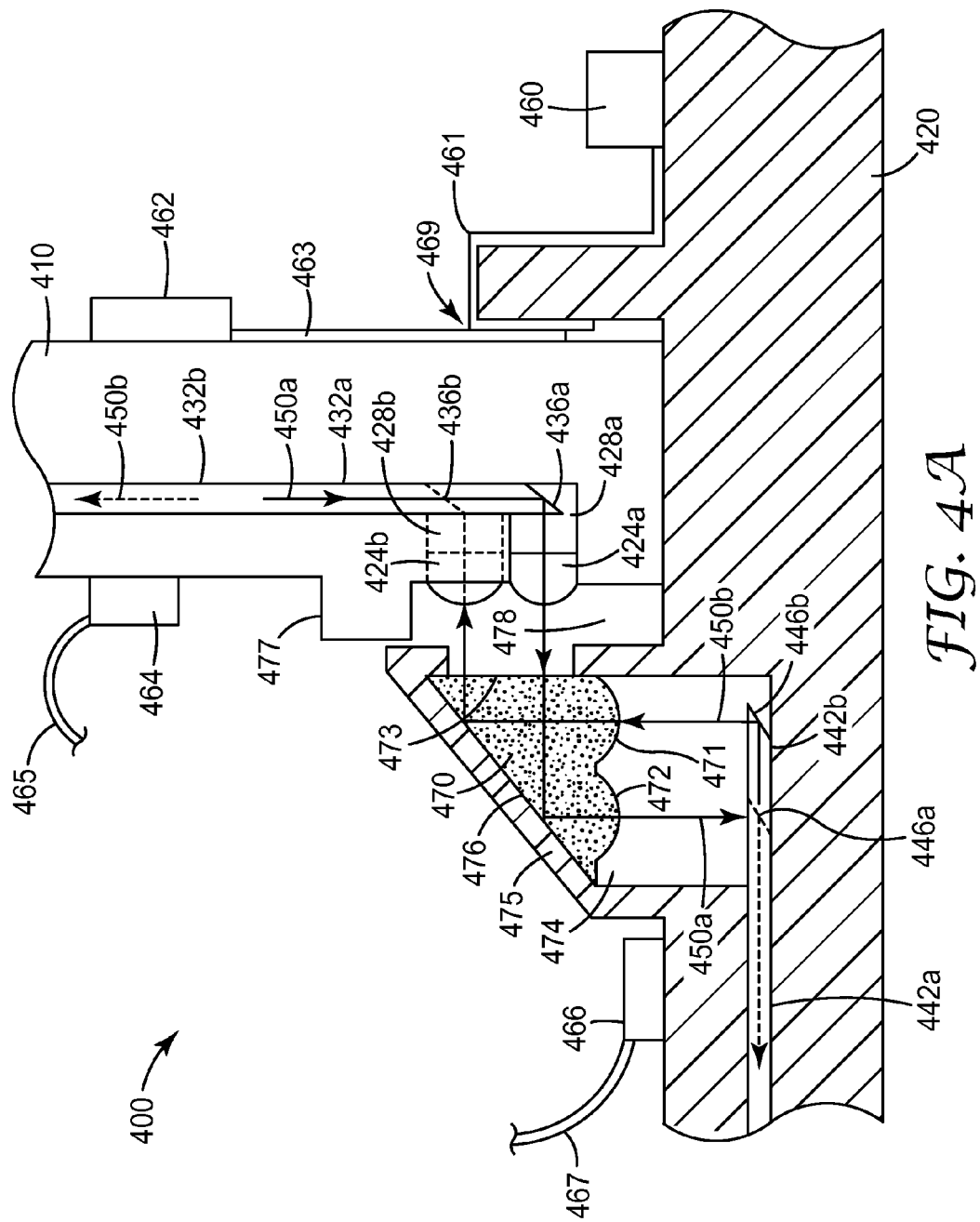
FIGS. 4A-4C show cross-sectional side views of embodiments of a PCB optical interconnect.

FIG. 4A shows a cross-sectional side view of a PCB optical interconnect 400, according to one aspect of the disclosure. Each of the elements 410-477 shown in FIG. 4 correspond to like-numbered elements shown in FIG. 3, which have been described previously. For example, first optical waveguide 432a in FIG. 4A corresponds to first optical waveguide 332a in FIG. 3, and so on. It is to be understood that the view presented in FIG. 4 shows a cross-section through the respective optical waveguides in a similar manner as the view presented and described with reference to FIG. 2 and FIG. 3.

Optical interconnect 400 includes a first PCB 410 connected to a second PCB 420 in a perpendicular orientation, and secured using a first connector element 475 formed in second PCB 420 and mated to a second connector element 477 formed in first PCB 410. First and second connector elements 475, 477 can include features to securely fasten the two PCBs together, and may also include additional electrical contacts, as described elsewhere. Each of the first and second PCBs 410, 420, includes a plurality of optical waveguides that are arranged in a staggered orientation similar to that shown in FIG. 1. Only two of the plurality of optical waveguides in each of the first and second PCBs 410, 420 is shown in FIG. 4A, although it is to be understood that there can be any desired number of staggered optical waveguides in the optical interconnect 400. First PCB 410 includes a first optical waveguide 432a with a first light extractor 436a, and a second optical waveguide 432b with a second light extractor 436b, disposed within the first PCB 410. First PCB 410 can also include a plurality of optional optoelectronic devices 464, and optical cables 465 capable of connecting to other components, as described elsewhere.

Second PCB 420 includes a third optical waveguide 442a with a third light extractor 446a, and a fourth optical waveguide 442b with a fourth light extractor 446b, disposed within the second PCB 420. Second PCB 420 can also include a plurality of optional optoelectronic devices 466, and optical cables 467 capable of connecting to other components, as described elsewhere. First PCB 410 and second PCB 420 can make electrical contact through first and second connector elements 475, 477 such that, for example, optional first electronic device 460 having a first electrical pad 461 connects and makes electrical contact 469 to optional second electronic device 462 having a second electrical pad 463. A corresponding optical connection between the first and second PCBs 410, 420, is made through microlenses that are associated with each of the optical waveguides, as described elsewhere.

A light re-directing element 470 including a reflective surface 476, a fourth microlens 471, a third microlens 472, and a first surface 473 is disposed within first connector element 475 such that light exiting one of the PCBs is redirected to enter the other PCB. In some cases, the light re-directing element 470 can be a prism having microlenses on one surface. In some cases (not shown), the light re-directing element 470 can instead include a reflector such as a minor and a separate array of microlenses. It is to be understood that the light re-directing element 470 can be affixed to either first PCB 410 or second PCB 420 (or associated with the structure and features of either first or second connector element 475, 477), as known to one of ordinary skill in the art.

A first optical via 428a exposes first light extractor 436a of first optical waveguide 432a, and a second optical via 428b exposes second light extractor 436b of second optical waveguide 232b. First microlens 424a is disposed to accept first light 450a from first light extractor 436a of first optical waveguide 432a. First light 450a passes through first microlens 424a, enters first surface 473, reflects from reflective surface 476, and exits light re-directing element 470 through third microlens 472. Third microlens 472 is disposed to focus first light 450a onto a third light extractor 446a of third optical waveguide 442a that has been exposed by optical via 474 in second PCB 420, thereby injecting first light 450a into third optical waveguide 442a.

Optical via 474 in second PCB 420 exposes fourth light extractor 446b of fourth optical waveguide 442b such that light travelling within fourth optical waveguide 442b is directed through fourth microlens 471, reflects from reflective surface 476, exits light re-directing element 470 through first surface 473 and is focused by second microlens 424b onto second light extractor 436b and injected into second optical waveguide 432b. In some cases, optical via 474 can instead be formed of separate optical vias (not shown) that separately expose the third and fourth light extractors 446a, 446b.

In a similar manner as described in FIGS. 2 and 3, the light extractors as shown in FIG. 4A can be angle-cleaved ends of the optical waveguides; however it is to be understood that any light extractor technique described herein may be substituted. Further, it is to be understood that each of the optical waveguides may be embedded or they may be disposed on the surface of each PCB in a manner similar to that described with reference to FIGS. 2 and 3. Still further, the optical interconnect 400 can be a bi-directional optical interconnect, as described elsewhere.

Figure 4B:
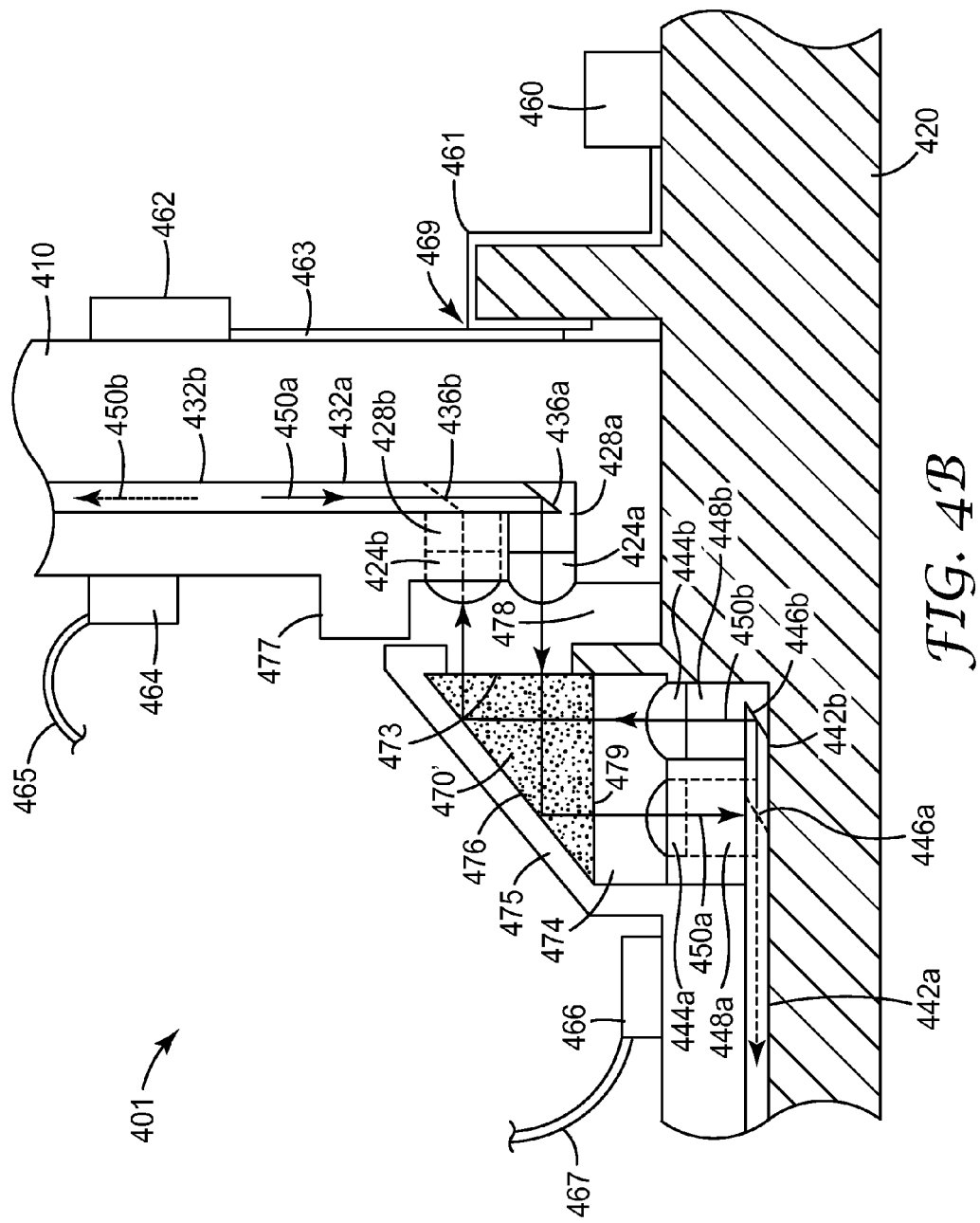

FIG. 4B shows a cross-sectional side view of a PCB optical interconnect 401, according to one aspect of the disclosure. Each of the elements 410-477 shown in FIG. 4B correspond to like-numbered elements shown in FIG. 4A, which have been described previously. For example, first optical waveguide 432a in FIG. 4A corresponds to first optical waveguide 432a in FIG. 4B, and so on. It is to be understood that the view presented in FIG. 4B shows a cross-section through the respective optical waveguides in a similar manner as the view presented and described with reference to FIG. 4A.

Optical interconnect 401 includes a first PCB 410 connected to a second PCB 420 in a perpendicular orientation, and secured using a first connector element 475 formed in second PCB 420 and mated to a second connector element 477 formed in first PCB 410. First and second connector elements 475, 477 can include features to securely fasten the two PCBs together, and may also include additional electrical contacts, as described elsewhere. Each of the first and second PCBs 410, 420, includes a plurality of optical waveguides that are arranged in a staggered orientation similar to that shown in FIG. 1. Only two of the plurality of optical waveguides in each of the first and second PCBs 410, 420 is shown in FIG. 4B, although it is to be understood that there can be any desired number of staggered optical waveguides in the optical interconnect 401. First PCB 410 includes a first optical waveguide 432a with a first light extractor 436a, and a second optical waveguide 432b with a second light extractor 436b, disposed within the first PCB 410. First PCB 410 can also include a plurality of optional optoelectronic devices 464, and optical cables 465 capable of connecting to other components, as described elsewhere.

Second PCB 420 includes a third optical waveguide 442a with a third light extractor 446a, and a fourth optical waveguide 442b with a fourth light extractor 446b, disposed within the second PCB 420. Second PCB 420 can also include a plurality of optional optoelectronic devices 466, and optical cables 467 capable of connecting to other components, as described elsewhere. First PCB 410 and second PCB 420 can make electrical contact through first and second connector elements 475, 477 such that, for example, optional first electronic device 460 having a first electrical pad 461 connects and makes electrical contact 469 to optional second electronic device 462 having a second electrical pad 463. A corresponding optical connection between the first and second PCBs 410, 420, is made through microlenses that are associated with each of the optical waveguides, as described elsewhere.

A light re-directing element 470' including a reflective surface 476, a first surface 473, and a second surface 479 is disposed within first connector element 475 such that light exiting one of the PCBs is redirected to enter the other PCB. In some cases, the light re-directing element 470' can be a prism. In some cases (not shown), the light re-directing element 470' can instead include a reflector such as a mirror. It is to be understood that the light re-directing element 470' can be affixed to either first PCB 410 or second PCB 420 (or associated with the structure and features of either first or second connector element 475, 477), as known to one of ordinary skill in the art.

A first optical via 428a exposes first light extractor 436a of first optical waveguide 432a, and a second optical via 428b exposes second light extractor 436b of second optical waveguide 232b. First microlens 424a is disposed to accept first light 450a from first light extractor 436a of first optical waveguide 432a. First light 450a passes through first microlens 424a, enters first surface 473, reflects from reflective surface 476, and exits light re-directing element 470' through second surface 479. A third microlens 444a focuses first light 450a onto a third light extractor 446a of third optical waveguide 442a that has been exposed by third optical via 448a in second PCB 420, thereby injecting first light 450a into third optical waveguide 442a.

A fourth optical via 448b in second PCB 420 exposes fourth light extractor 446b of fourth optical waveguide 442b such that light travelling within fourth optical waveguide 442b is directed through fourth microlens 444b, enters second surface 479 of light re-directing element 470', reflects from reflective surface 476, exits light re-directing element 470' through first surface 473 and is focused by second microlens 424b onto second light extractor 436b and injected into second optical waveguide 432b.

In a similar manner as described in FIG. 4A, the light extractors as shown in FIG. 4B can be angle-cleaved ends of the optical waveguides; however it is to be understood that any light extractor technique described herein may be substituted. Further, it is to be understood that each of the optical waveguides may be embedded or they may be disposed on the surface of each PCB in a manner similar to that described with reference to FIG. 4A. Still further, the optical interconnect 401 can be a bi-directional optical interconnect, as described elsewhere.

Figure 4C:
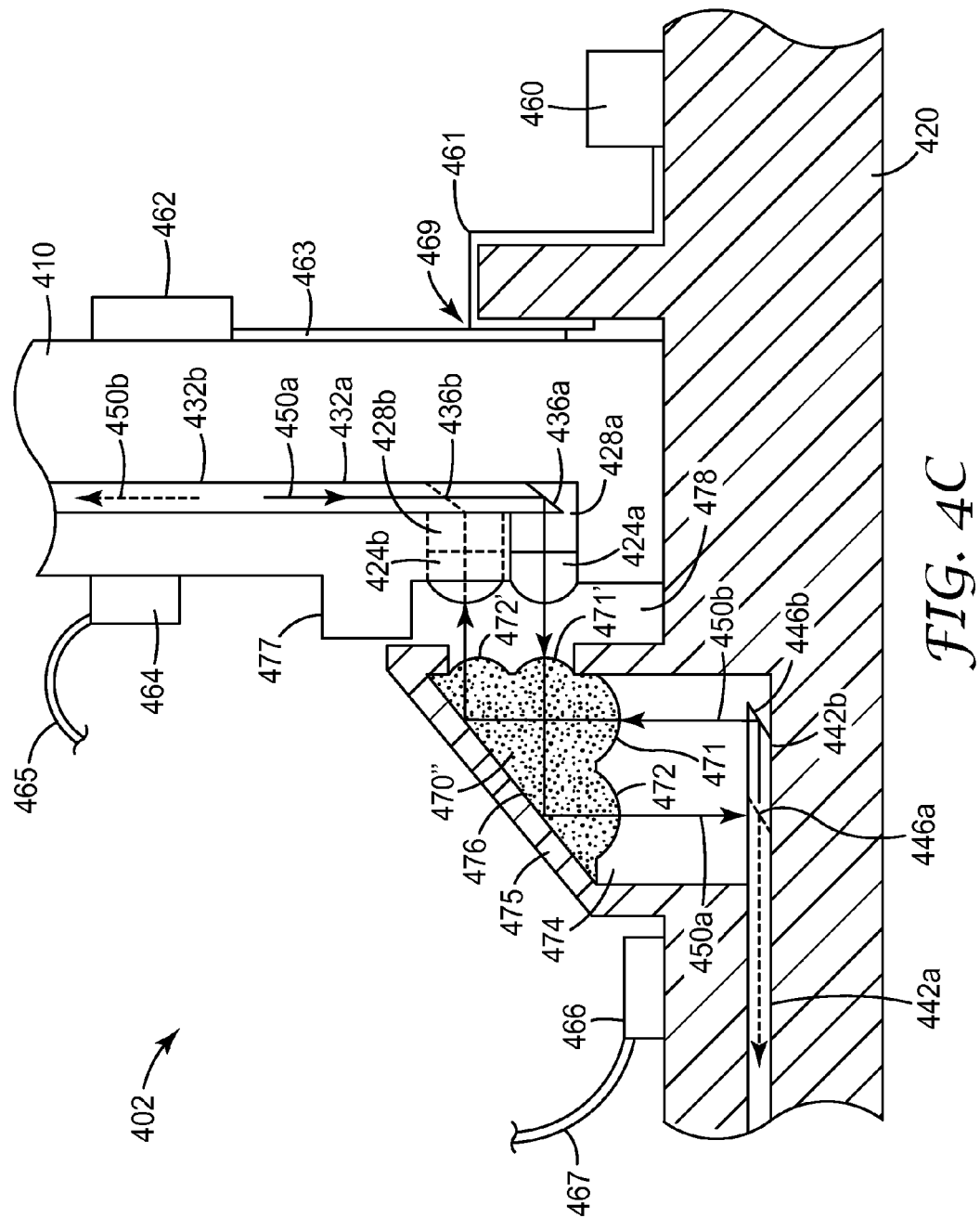

FIG. 4C shows a cross-sectional side view of a PCB optical interconnect 402, according to one aspect of the disclosure. Each of the elements 410-477 shown in FIG. 4C correspond to like-numbered elements shown in FIG. 4A, which have been described previously. For example, first optical waveguide 432a in FIG. 4C corresponds to first optical waveguide 432a in FIG. 4B, and so on. It is to be understood that the view presented in FIG. 4C shows a cross-section through the respective optical waveguides in a similar manner as the view presented and described with reference to FIG. 4A.

Optical interconnect 402 includes a first PCB 410 connected to a second PCB 420 in a perpendicular orientation, and secured using a first connector element 475 formed in second PCB 420 and mated to a second connector element 477 formed in first PCB 410. First and second connector elements 475, 477 can include features to securely fasten the two PCBs together, and may also include additional electrical contacts, as described elsewhere. Each of the first and second PCBs 410, 420, includes a plurality of optical waveguides that are arranged in a staggered orientation similar to that shown in FIG. 1. Only two of the plurality of optical waveguides in each of the first and second PCBs 410, 420 is shown in FIG. 4C, although it is to be understood that there can be any desired number of staggered optical waveguides in the optical interconnect 402. First PCB 410 includes a first optical waveguide 432a with a first light extractor 436a, and a second optical waveguide 432b with a second light extractor 436b, disposed within the first PCB 410. First PCB 410 can also include a plurality of optional optoelectronic devices 464, and optical cables 465 capable of connecting to other components, as described elsewhere.

Second PCB 420 includes a third optical waveguide 442a with a third light extractor 446a, and a fourth optical waveguide 442b with a fourth light extractor 446b, disposed within the second PCB 420. Second PCB 420 can also include a plurality of optional optoelectronic devices 466, and optical cables 467 capable of connecting to other components, as described elsewhere. First PCB 410 and second PCB 420 can make electrical contact through first and second connector elements 475, 477 such that, for example, optional first electronic device 460 having a first electrical pad 461 connects and makes electrical contact 469 to optional second electronic device 462 having a second electrical pad 463. A corresponding optical connection between the first and second PCBs 410, 420, is made through microlenses that are associated with each of the optical waveguides, as described elsewhere.

A light re-directing element 470" including a reflective surface 476, a first microlens 471' adjacent a second microlens 472', and a third microlens 472 adjacent a fourth microlens 471, disposed within first connector element 475 such that light exiting one of the PCBs is redirected to enter the other PCB. In some cases, the light re-directing element 470" can be a prism, and each adjacent set of microlenses can be disposed on orthogonal surfaces of the prism. In some cases (not shown), the light re-directing element 470" can instead include a reflector such as a minor and two orthogonal arrays of microlenses. It is to be understood that the light re-directing element 470" can be affixed to either first PCB 410 or second PCB 420 (or associated with the structure and features of either first or second connector element 475, 477), as known to one of ordinary skill in the art.

A first optical via 478 can expose first light extractor 436a of first optical waveguide 432a, and second light extractor 436b of second optical waveguide 232b, or separate optical vias can be used for both (not shown). First microlens 471' is disposed to accept first light 450a from first light extractor 436a of first optical waveguide 432a. First light 450a passes through first microlens 471', reflects from reflective surface 476, and exits light re-directing element 470' through third microlens 472. Third microlens 472 focuses first light 450a onto a third light extractor 446a of third optical waveguide 442a exposed by a second optical via 474, thereby injecting first light 450a into third optical waveguide 442a.

The second optical via 474 in second PCB 420 also exposes fourth light extractor 446b of fourth optical waveguide 442b such that light travelling within fourth optical waveguide 442b is directed through fourth microlens 471, reflects from reflective surface 476, exits light re-directing element 470", and is focused by second microlens 472' onto second light extractor 436b and injected into second optical waveguide 432b.

In a similar manner as described in FIG. 4A, the light extractors as shown in FIG. 4C can be angle-cleaved ends of the optical waveguides; however it is to be understood that any light extractor technique described herein may be substituted. Further, it is to be understood that each of the optical waveguides may be embedded or they may be disposed on the surface of each PCB in a manner similar to that described with reference to FIG. 4A. Still further, the optical interconnect 402 can be a bi-directional optical interconnect, as described elsewhere.

Figure 5:
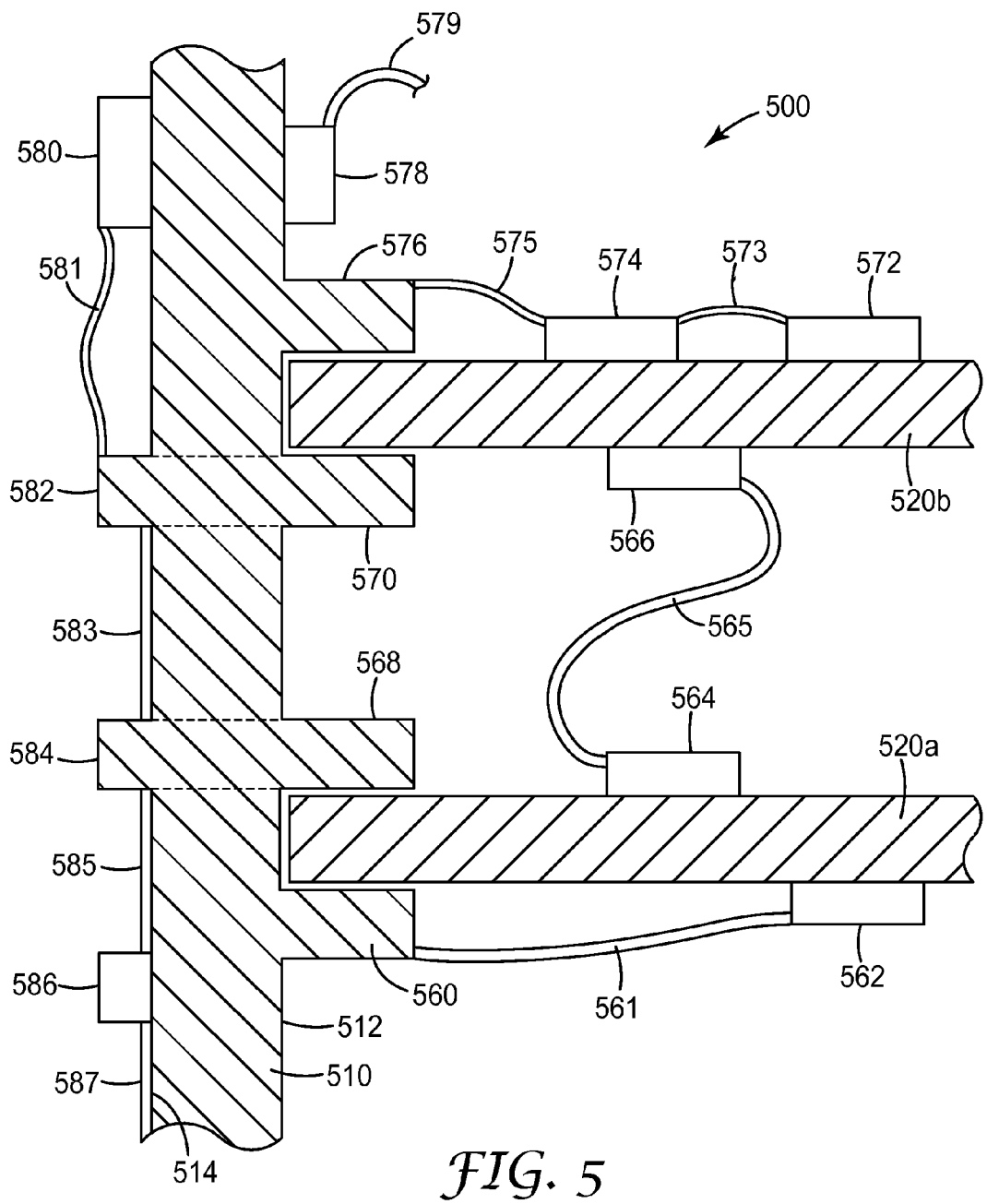
FIG. 5 shows an end view of connected PCBs.

FIG. 5 shows an end view of connected PCBs 500, according to one aspect of the disclosure. Connected PCBs 500 include a backplane PCB 510 having a first blade PCB 520a and a second blade PCB 520b connected to a first major surface 512 of the backplane PCB 510. It is to be understood that the optical waveguides of FIG. 5 can generally be optical, or opto-electrical waveguides that can be disposed embedded within, on the surface of, or above, the respective PCBs. Further, electrical connections can also be made between the various components as generally known in the art. Still further, it is to be understood that the relative placement and number of optoelectronic devices, interconnects, and blade PCBs is for illustration only, and any desired number and placement can be used as known to one of ordinary skill in the art.

In one particular embodiment, the first blade PCB 520a includes an optional first optoelectronic device 562 and an optional second optoelectronic device 564 disposed on the same surface or different surfaces of first blade PCB 520a. First blade PCB 520a can be connected to the backplane PCB 510 through a first optical connector 568 and a first optoelectronic connector 560. First optical connector 568 can include any of the optical interconnects 200, 300, and 400-402 described with reference to FIGS. 2-4C. In some cases, first optoelectronic connector 560 can be connected to optional first optoelectronic device 562 using a first optical waveguide 561.

In one particular embodiment, the second blade PCB 520b includes an optional third optoelectronic device 566, optional fourth optoelectronic device 572, and an optional fifth optoelectronic device 574 disposed on the same surface or different surfaces of second blade PCB 520b. Second blade PCB 520b can be connected to the backplane PCB 510 through a second optical connector 570 and a second optoelectronic connector 576. Second optical connector 570 can include any of the optical interconnects 200, 300, and 400-402 described with reference to FIGS. 2-4C. In some cases, optional third optoelectronic device 566 (on second blade PCB 520b) can be connected to optional second optoelectronic device 564 (on first blade PCB 520a); second optoelectronic connector 576 can be connected to optional fifth optoelectronic device 574 using a third optical waveguide 575; and optional fifth optoelectronic device 574 can be connected to optional fourth optoelectronic device 572 using a fourth optical waveguide 573. In some cases, connections can also be made to other external systems (not shown), such as through a fifth optical waveguide 579 connected to a sixth optoelectronic device 578 on first major surface 512 of backplane PCB 510.

Electrical, optical, or optoelectronic connections can optionally be made from the first major surface 512 to a second major surface 514 of backplane PCB 510. In one particular embodiment, first optical connector 568 can be in electrical, optical, or optoelectronic connection with the second major surface 514 of backplane PCB 510 through first backside connector 584; and second optical connector 570 can be in electrical, optical, or optoelectronic connection with the second major surface 514 of backplane PCB 510 through second backside connector 582. First backside connector 584 can further be connected using a first, a second, and a third backside optical waveguide 583, 585, 587, respectively, to other optional devices such as first backside optoelectronic device 586 and second backside connector 582. Second backside connector 582 can be further connected to second backside optoelectronic device 580 by fourth backside optical waveguide 581.

Figure 6A:
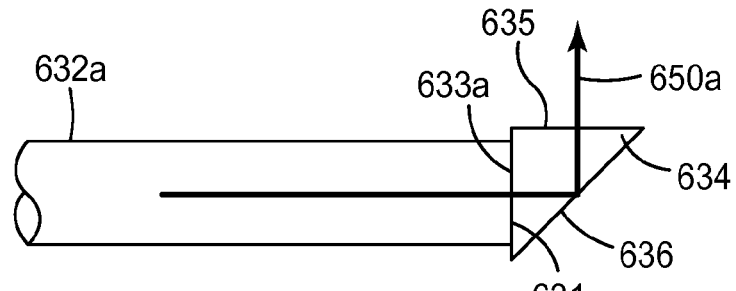
FIGS. 6A-6C show schematic views of embodiments of a light extractor.
Figure 6B:
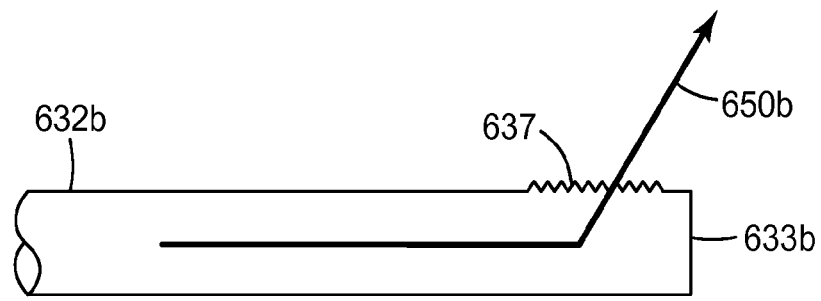
Figure 6C:
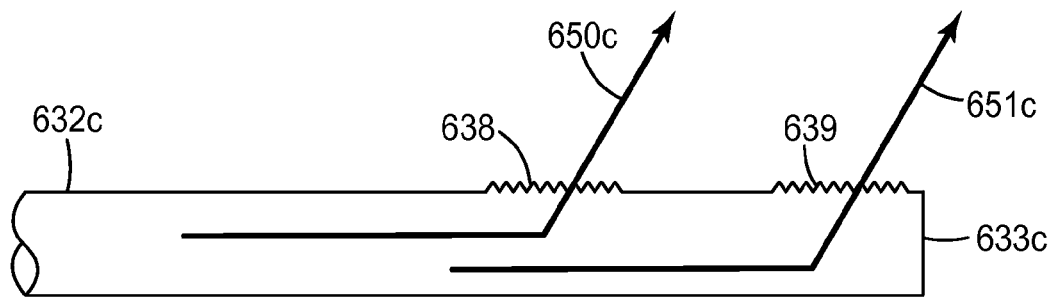

FIGS. 6A-6C show schematic views of embodiments of a light extractor, according to one aspect of the disclosure. FIG. 6A shows an optical waveguide 632a having an end 633a that is place adjacent an input surface 631 of a prism 634. Prism 634 includes a reflective diagonal surface 636 and an output surface 635. A light 650a travelling within optical waveguide 632a enters input surface 631 of prism 634, reflects from reflective diagonal surface 636, and exits prism 634 through output surface 635 in a different direction. Reflective diagonal surface 636 can be a polished surface such that light 650a reflects by TIR, or it can include reflective layers including dielectric stacks or organic or inorganic materials, or it can include a reflective metal. In some cases, prism 634 can instead be replaced by a flat mirror (not shown) disposed in the same location relative to end 633a, as reflective diagonal surface 636. In some cases, prism 634 can instead be replaced by cleaving the optical waveguide 632a to create the reflective diagonal surface 636, as described elsewhere.

FIG. 6B shows an optical waveguide 632b having an end 633b and a light extraction grating 637 disposed on the surface of optical waveguide 632b, to extract light 650b travelling within optical waveguide 632b such that the extracted light leaves the optical waveguide in a different direction, as known to one of skill in the art. In some cases the light extraction grating 637 can be designed to extract light 650b of one particular wavelength from optical waveguide 632b.

FIG. 6C shows an optical waveguide 632c having an end 633c, a first light extraction grating 638, and a second light extraction grating 639 disposed on the surface of the optical waveguide 632c. First light extraction grating 638 is disposed to extract first light 650c having a first wavelength and second light extraction grating 639 is disposed to extract second light 651c having a second wavelength, both travelling within optical waveguide 632b, such that the extracted lights leave the optical waveguide in a different direction.

Following are a list of embodiments of the present disclosure.

Item 1 is an optical interconnect assembly, comprising: a first printed circuit board (PCB) assembly comprising: a first PCB; and a plurality of first optical waveguides with light extractors disposed on or within the first PCB, the light extractors being staggered relative to one another; a second PCB assembly comprising: a second PCB plugged into a first side of the first PCB via an electrical connector; and a plurality of second optical waveguides with light extractors disposed on or within the second PCB, the light extractors being staggered relative to one another, each second optical waveguide in the plurality of second optical waveguides corresponding to a different first optical waveguide in the plurality of first optical waveguides; a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the light extractors of each first optical waveguide in the plurality of first optical waveguides and the corresponding second optical waveguide in the plurality of second optical waveguides being so oriented that light traveling within the first optical waveguide enters the second optical waveguide after being redirected by the light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the light extractor of the second optical waveguide.

Item 2 is the optical interconnect assembly of item 1, wherein each of the light extractors comprise an angle cleaved end face, a light re-directing prism, a planar reflector, an extraction grating, or a combination thereof.

Item 3 is the optical interconnect assembly of item 1 or item 2, wherein one of the first and second PCBs is a backplane PCB.

Item 4 is the optical interconnect assembly of item 1 to item 3, wherein the first PCB comprises at least a first semiconductor chip mounted thereon.

Item 5 is the optical interconnect assembly of item 1 to item 4, wherein the second PCB comprises at least a second semiconductor chip mounted thereon.

Item 6 is the optical interconnect assembly of item 1 to item 5, wherein each of the first and second PCBs comprises at least one semiconductor chip mounted thereon.

Item 7 is the optical interconnect assembly of item 1 to item 6, further comprising at least one optoelectronic device disposed on each of the first and second PCBs.

Item 8 is the optical interconnect assembly of item 7, wherein the at least one optoelectronic device comprises a light emitting device.

Item 9 is the optical interconnect assembly of item 7, wherein the at least one optoelectronic device comprises a light detecting device.

Item 10 is the optical interconnect assembly of item 1 to item 9, wherein at least some of the optical waveguides in the pluralities of first and second optical waveguides are embedded within their respective PCBs.

Item 11 is the optical interconnect assembly of item 1 to item 10, further comprising a first optical cable comprising the plurality of the first optical waveguides in the plurality of the first optical waveguides, a first portion of the first optical cable being positioned on the first PCB and a second portion of the first optical cable not being positioned on the first PCB, the first portion comprising the light extractors of the first optical waveguides in the plurality of the first optical waveguides.

Item 12 is the optical interconnect assembly of item 11, wherein each first optical waveguide in the plurality of first optical waveguides is an optical fiber.

Item 13 is the optical interconnect assembly of item 1 to item 12, further comprising a second optical cable comprising the plurality of the second optical waveguides in the plurality of the second optical waveguides, a first portion of the second optical cable being positioned on the second PCB and a second portion of the second optical cable not being positioned on the second PCB, the first portion comprising the light extractors of the second optical waveguides in the plurality of the second optical waveguides.

Item 14 is the optical interconnect assembly of item 13, wherein each second optical waveguide in the plurality of second optical waveguides is an optical fiber.

Item 15 is the optical interconnect assembly of item 1 to item 14, further comprising a light redirecting element disposed between the plurality of the first microlenses and the plurality of second microlenses, the light extractors of each first optical waveguide in the plurality of first optical waveguides and the corresponding second optical waveguide in the plurality of second optical waveguides being so oriented that light traveling within the first optical waveguide enters the second optical waveguide after being redirected by the light extractor of the first optical waveguide, exiting the first optical waveguide, traveling through the first microlens in the plurality of first microlenses corresponding to the first optical waveguide, being redirected by the light redirecting element, traveling through the second microlens in the plurality of second microlenses corresponding to the second optical waveguide, and being redirected by the light extractor of the second optical waveguide.

Item 16 is the optical interconnect assembly of item 15, wherein the light redirecting element redirects light by total internal reflection.

Item 17 is the optical interconnect assembly of item 15 or item 16, wherein the first microlenses in the plurality of first microlenses are disposed on a first major surface of the light redirecting element and the second microlenses in the plurality of second microlenses are disposed on a second major surface of the light redirecting element, the second major surface making an oblique angle with the first major surface.

Item 18 is the optical interconnect assembly of item 1 to item 17, wherein the light redirecting element is prismatic.

Item 19 is the optical interconnect assembly of item 1 to item 18, wherein the first microlenses in the plurality of first microlenses are disposed on the first PCB.

Item 20 is the optical interconnect assembly of item 19, wherein the first optical waveguides in the plurality of the first optical waveguides are embedded within the first PCB.

Item 21 is the optical interconnect assembly of item 1 to item 20, wherein the second microlenses in the plurality of second microlenses are disposed on the second PCB.

Item 22 is the optical interconnect assembly of item 21, wherein the second optical waveguides in the plurality of the second optical waveguides are embedded within the second PCB.

Item 23 is the optical interconnect assembly of item 1 to item 22, wherein the first microlenses in the plurality of first microlenses are disposed on the first PCB, the second microlenses in the plurality of second microlenses are disposed on the second PCB, the first optical waveguides in the plurality of the first optical waveguides are embedded within the first PCB, and the second optical waveguides in the plurality of the second optical waveguides are embedded within the second PCB.

Item 24 is an optical interconnect assembly, comprising: a plurality of first optical waveguides disposed in a first plane, each first optical waveguide comprising a first light extractor, the first light extractors being staggered relative to one another; a plurality of second optical waveguides disposed in a second plane making an oblique angle with the first plane, each second optical waveguide comprising a second light extractor, the second light extractors being staggered relative to one another, each second optical waveguide in the plurality of second optical waveguides corresponding to a different first optical waveguide in the plurality of first optical waveguides; a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

Item 25 is the optical interconnect assembly of item 24, wherein the first optical waveguides in the plurality of first optical waveguides are disposed on or within a first PCB, and the second optical waveguides in the plurality of second optical waveguides are disposed on or within a second PCB plugged into a first side of the first PCB via an electrical connector.

Item 26 is the optical interconnect assembly of item 24 or item 25, wherein the first light extractor of each first optical waveguide is one of a grating, a reflector embedded within the first optical waveguide, and an angle cleaved end face of the first optical waveguide.

Item 27 is the optical interconnect assembly of item 24 to item 26, wherein the second light extractor of each second optical waveguide is one of a grating, a reflector embedded within the second optical waveguide, and an angle cleaved end face of the second optical waveguide.

Item 28 is the optical interconnect assembly of item 24 to item 27, wherein each of the light extractors comprise an angle cleaved end face, a light re-directing prism, a planar mirror, an extraction grating, or a combination thereof.

Item 29 is the optical interconnect assembly of item 28, wherein each extraction grating comprises a first wavelength selective extraction grating and a different second wavelength selective extraction grating.

Item 30 is an optical interconnect assembly, comprising: a first printed circuit board (PCB); a second PCB plugged into the first PCB via an electrical connector and comprising a first optoelectronic device mounted thereon; a plurality of first optical waveguides, a first end of each first optical waveguide being optically coupled to the first optoelectronic device, each first optical waveguide comprising a first light extractor, the first light extractors in the plurality of first optical waveguides being staggered relative to one another; a plurality of second optical waveguides, each second optical waveguide comprising a second light extractor, the second light extractors in the plurality of second optical waveguides being staggered relative to one another, each second optical waveguide in the plurality of second optical waveguides corresponding to a different first optical waveguide in the plurality of first optical waveguides; and an optical coupler mounted on the first PCB and comprising: a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

Item 31 is the optical interconnect assembly of item 30, wherein the first light extractor of each first optical waveguide is one of a grating, a reflector embedded within the first optical waveguide, and an angle cleaved end face of the first optical waveguide.

Item 32 is the optical interconnect assembly of item 30 or item 31, wherein the second light extractor of each second optical waveguide is one of a grating, a reflector embedded within the second optical waveguide, and an angle cleaved end face of the second optical waveguide.

Item 33 is the optical interconnect assembly of item 30 to item 32, wherein each of the light extractors comprise an angle cleaved end face, a light re-directing prism, a planar mirror, an extraction grating, or a combination thereof.

Item 34 is the optical interconnect assembly of item 33, wherein each extraction grating comprises a first wavelength selective extraction grating and a different second wavelength selective extraction grating.

Item 35 is the optical interconnect assembly of item 30 to item 34, wherein each first optical waveguide in the plurality of first optical waveguides and each second optical waveguide in the plurality of second optical waveguides is an optical fiber.

Item 36 is the optical interconnect assembly of item 30 to item 35, wherein the optical coupler can be releasably attached to the first optoelectronic device.

Item 37 is an optical interconnect assembly, comprising: a plurality of first optical waveguides disposed on or within a first printed circuit board (PCB), each first optical waveguide comprising an end face; a plurality of second optical waveguides disposed on or within a second PCB, each second optical waveguide comprising a light extractor, the light extractors being staggered relative to one another, each second optical waveguide in the plurality of second optical waveguides corresponding to a different first optical waveguide in the plurality of first optical waveguides; a plurality of first microlenses, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the end face of each first optical waveguide in the plurality of first optical waveguides and the light extractor of the corresponding second optical waveguide in the plurality of second optical waveguides being so oriented that light traveling within the first optical waveguide enters the second optical waveguide after exiting the first optical waveguide through the end face of the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

Item 38 is the optical interconnect assembly of item 37, wherein the first light extractor of each first optical waveguide is one of a grating, a reflector embedded within the first optical waveguide, and an angle cleaved end face of the first optical waveguide.

Item 39 is the optical interconnect assembly of item 37 or item 38, wherein the second light extractor of each second optical waveguide is one of a grating, a reflector embedded within the second optical waveguide, and an angle cleaved end face of the second optical waveguide.

Item 40 is the optical interconnect assembly of item 37 to item 39, wherein each of the light extractors comprise an angle cleaved end face, a light re-directing prism, a planar mirror, an extraction grating, or a combination thereof.

Item 41 is the optical interconnect assembly of item 40, wherein each extraction grating comprises a first wavelength selective extraction grating and a different second wavelength selective extraction grating.

Item 42 is the optical interconnect assembly of item 37 to item 41, wherein each first optical waveguide in the plurality of first optical waveguides and each second optical waveguide in the plurality of second optical waveguides is an optical fiber.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An optical interconnect assembly, comprising:
   a first printed circuit board (PCB) assembly comprising:
      a first PCB; and
      a plurality of first optical waveguides with light extractors disposed on or within the first PCB, the light extractors being staggered relative to one another;
   a second PCB assembly comprising:
      a second PCB plugged into a first side of the first PCB via an electrical connector; and
      a plurality of second optical waveguides with light extractors disposed on or within the second PCB, the light extractors being staggered relative to one another, each second optical waveguide in the plurality of second optical waveguides corresponding to a different first optical waveguide in the plurality of first optical waveguides;
   a plurality of first microlenses staggered relative to one another, each first microlens in the plurality of first microlenses corresponding to a different first optical waveguide in the plurality of first optical waveguides; and
   a plurality of second microlenses staggered relative to one another, each second microlens in the plurality of second microlenses corresponding to a different second optical waveguide in the plurality of second optical waveguides,
   the light extractors of each first optical waveguide in the plurality of first optical waveguides and the corresponding second optical waveguide in the plurality of second optical waveguides being so oriented that light traveling within the first optical waveguide enters the second optical waveguide after being redirected by the light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the light extractor of the second optical waveguide.

2. The optical interconnect assembly of claim 1, wherein each of the light extractors comprise an angle cleaved end face, a light re-directing prism, a planar reflector, an extraction grating, or a combination thereof.

3. The optical interconnect assembly of claim 1, further comprising at least one optoelectronic device disposed on each of the first and second PCBs.

4. The optical interconnect assembly of claim 1, wherein at least some of the optical waveguides in the pluralities of first and second optical waveguides are embedded within their respective PCBs.

5. The optical interconnect assembly of claim 1, further comprising a first optical cable comprising the plurality of the first optical waveguides in the plurality of the first optical waveguides, a first portion of the first optical cable being positioned on the first PCB and a second portion of the first optical cable not being positioned on the first PCB, the first portion comprising the light extractors of the first optical waveguides in the plurality of the first optical waveguides.

6. The optical interconnect assembly of claim 1, further comprising a second optical cable comprising the plurality of the second optical waveguides in the plurality of the second optical waveguides, a first portion of the second optical cable being positioned on the second PCB and a second portion of the second optical cable not being positioned on the second PCB, the first portion comprising the light extractors of the second optical waveguides in the plurality of the second optical waveguides.

7. The optical interconnect assembly of claim 1, further comprising a light redirecting element disposed between the plurality of the first microlenses and the plurality of second microlenses, the light extractors of each first optical waveguide in the plurality of first optical waveguides and the corresponding second optical waveguide in the plurality of second optical waveguides being so oriented that light traveling within the first optical waveguide enters the second optical waveguide after being redirected by the light extractor of the first optical waveguide, exiting the first optical waveguide, traveling through the first microlens in the plurality of first microlenses corresponding to the first optical waveguide, being redirected by the light redirecting element, traveling through the second microlens in the plurality of second microlenses corresponding to the second optical waveguide, and being redirected by the light extractor of the second optical waveguide.

8. The optical interconnect assembly of claim 7, wherein the light redirecting element redirects light by total internal reflection.

9. The optical interconnect assembly of claim 7, wherein the first microlenses in the plurality of first microlenses are disposed on a first major surface of the light redirecting element and the second microlenses in the plurality of second microlenses are disposed on a second major surface of the light redirecting element, the second major surface making an oblique angle with the first major surface.

10. The optical interconnect assembly of claim 1, wherein the first microlenses in the plurality of first microlenses are disposed on the first PCB, the second microlenses in the plurality of second microlenses are disposed on the second PCB, the first optical waveguides in the plurality of the first optical waveguides are embedded within the first PCB, and the second optical waveguides in the plurality of the second optical waveguides are embedded within the second PCB.

11. An optical interconnect assembly, comprising:
a plurality of first optical waveguides disposed in a first plane, each first optical waveguide comprising a first light extractor, the first light extractors being staggered relative to one another;
a plurality of second optical waveguides disposed in a second plane making an oblique angle with the first plane, each second optical waveguide comprising a second light extractor, the second light extractors being staggered relative to one another, each second optical waveguide in the plurality of second optical waveguides corresponding to a different first optical waveguide in the plurality of first optical waveguides;
a plurality of first microlenses staggered relative to one another, each first microlens in the plurality of first microlenses corresponding to a different first optical waveguide in the plurality of first optical waveguides; and
a plurality of second microlenses staggered relative to one another, each second microlens in the plurality of second microlenses corresponding to a different second optical waveguide in the plurality of second optical waveguides,
the first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

12. The optical interconnect assembly of claim 11, wherein the first optical waveguides in the plurality of first optical waveguides are disposed on or within a first PCB, and the second optical waveguides in the plurality of second optical waveguides are disposed on or within a second PCB plugged into a first side of the first PCB via an electrical connector.

13. The optical interconnect assembly of claim 11, wherein the first light extractor of each first optical waveguide is one of a grating, a reflector embedded within the first optical waveguide, and an angle cleaved end face of the first optical waveguide.

14. The optical interconnect assembly of claim 11, wherein the second light extractor of each second optical waveguide is one of a grating, a reflector embedded within the second optical waveguide, and an angle cleaved end face of the second optical waveguide.

15. The optical interconnect assembly of claim 11, wherein each extraction grating comprises a first wavelength selective extraction grating and a different second wavelength selective extraction grating.

16. An optical interconnect assembly, comprising:
a first printed circuit board (PCB);
a second PCB plugged into the first PCB via an electrical connector and comprising a first optoelectronic device mounted thereon;
a plurality of first optical waveguides, a first end of each first optical waveguide being optically coupled to the first optoelectronic device, each first optical waveguide comprising a first light extractor, the first light extractors in the plurality of first optical waveguides being staggered relative to one another;
a plurality of second optical waveguides, each second optical waveguide comprising a second light extractor, the second light extractors in the plurality of second optical waveguides being staggered relative to one another, each second optical waveguide in the plurality of second optical waveguides corresponding to a different first optical waveguide in the plurality of first optical waveguides; and
an optical coupler mounted on the first PCB and comprising:
a plurality of first microlenses staggered relative to one another, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the first light extractor of each first optical waveguide in the plurality of first optical waveguides and the second light extractor of the corresponding second optical waveguide in the plurality of second optical waveguides being so oriented that light traveling within the first optical waveguide enters the second optical waveguide after being redirected by the first light extractor of the first optical waveguide, exiting the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

17. The optical interconnect assembly of claim 16, wherein each of the light extractors comprise an angle cleaved end face, a light re-directing prism, a planar mirror, an extraction grating, or a combination thereof.

18. The optical interconnect assembly of claim 17, wherein each extraction grating comprises a first wavelength selective extraction grating and a different second wavelength selective extraction grating.

19. An optical interconnect assembly, comprising:
a plurality of first optical waveguides disposed on or within a first printed circuit board (PCB), each first optical waveguide comprising an end face;

a plurality of second optical waveguides disposed on or within a second PCB, each second optical waveguide comprising a light extractor, the light extractors being staggered relative to one another, each second optical waveguide in the plurality of second optical waveguides corresponding to a different first optical waveguide in the plurality of first optical waveguides;

a plurality of first microlenses, each first microlens in the plurality of first microlenses corresponding to a different first optical waveguide in the plurality of first optical waveguides; and a plurality of second microlenses staggered relative to one another, each second microlens in the plurality of second microlenses corresponding to a different second optical waveguide in the plurality of second optical waveguides, the end face of each first optical waveguide in the plurality of first optical waveguides and the light extractor of the corresponding second optical waveguide in the plurality of second optical waveguides being so oriented that light traveling within the first optical waveguide enters the second optical waveguide after exiting the first optical waveguide through the end face of the first optical waveguide, traveling through the first microlens in the plurality of first microlenses corresponding to the first optical waveguide, traveling through the second microlens in the plurality of second microlenses corresponding to the second optical waveguide, and being redirected by the second light extractor of the second optical waveguide.

20. The optical interconnect assembly of claim 19, wherein each of the light extractors comprise an angle cleaved end face, a light re-directing prism, a planar mirror, an extraction grating, or a combination thereof.

* * * * *

UNITED STATES PATENT AND TRADEMARK OFFICE
CERTIFICATE OF CORRECTION

| | | |
|---|---|---|
| PATENT NO. | : 9,134,494 B2 | Page 1 of 1 |
| APPLICATION NO. | : 14/391046 | |
| DATED | : September 15, 2015 | |
| INVENTOR(S) | : Ding Wang et al. | |

It is certified that error appears in the above-identified patent and that said Letters Patent is hereby corrected as shown below:

In the specification

Column 4
Line 52, Delete "scale" and insert -- scale. -- therefor.

Column 6
Line 50, Delete "minor" and insert -- mirror -- therefor.

Column 6
Line 53, Delete "minor" and insert -- mirror -- therefor.

Column 7
Line 16, Delete "minor" and insert -- mirror -- therefor.

Column 12
Line 66, Delete "minor" and insert -- mirror -- therefor.

Column 14
Line 24, Delete "minor" and insert -- mirror -- therefor.

Column 17
Line 13, Delete "minor" and insert -- mirror -- therefor.

Signed and Sealed this
Seventeenth Day of May, 2016

Michelle K. Lee
*Director of the United States Patent and Trademark Office*